United States Patent

Kawakita et al.

[11] Patent Number: 6,015,872
[45] Date of Patent: Jan. 18, 2000

[54] SUBSTRATE FOR PRINTED CIRCUIT BOARD

[75] Inventors: Yoshihiro Kawakita, Neyagawa; Masanaru Hasegawa, Yawata; Kazunori Sakamoto; Hideo Hatanaka, both of Katano, all of Japan

[73] Assignee: Matsushita Electric Industrial Co., Ltd., Japan

[21] Appl. No.: 09/081,815

[22] Filed: May 20, 1998

[30] Foreign Application Priority Data

May 22, 1997 [JP] Japan .................................. 9-132100

[51] Int. Cl.[7] ........................................................ B32B 7/12
[52] U.S. Cl. ............................................ 528/102; 428/901
[58] Field of Search ............................. 428/901; 528/102, 528/98; 525/527

[56] References Cited

U.S. PATENT DOCUMENTS

| | | | |
|---|---|---|---|
| 4,874,669 | 10/1989 | Larson et al. | 428/416 |
| 4,997,702 | 3/1991 | Gazit et al. | 428/283 |
| 5,102,970 | 4/1992 | Wang | 528/98 |
| 5,112,926 | 5/1992 | Lee et al. | 525/526 |
| 5,412,002 | 5/1995 | Enomoto et al. | 523/466 |

FOREIGN PATENT DOCUMENTS

| | | |
|---|---|---|
| 3-285907 | 12/1991 | Japan . |
| 3-285910 | 12/1991 | Japan . |
| 6-268345 | 9/1994 | Japan . |
| 7-82343 | 3/1995 | Japan . |
| 9-194610 | 7/1997 | Japan . |

*Primary Examiner*—Daniel Zirker
*Attorney, Agent, or Firm*—Parkhurst & Wendel, L.L.P

[57] ABSTRACT

To address the problem of difficulty of making compatible flame retarding property and electrical and mechanical characteristics in conventional printed interconnection substrates, the present invention employs, in a substrate for printed circuit board of which the insulating material comprises a thermosetting resin composition comprising an epoxy resin main component and a curing agent, an epoxy resin containing a brominated phenol novolac type epoxy resin having a biphenyl skeleton as the main component or a curing agent containing a brominated phenol novolac type curing resin. It provides a substrate for printed circuit board which has an extremely high flame retarding property and a superior heat resistance and humidity resistance, as well as a high insulating reliability and a superior high frequency characteristic.

9 Claims, No Drawings

SUBSTRATE FOR PRINTED CIRCUIT BOARD

FIELD OF THE INVENTION

The present invention relates to the substrate for formation of a printed circuit board suitable for high-density mounting to be used in various electronic equipment, and in particular to a substrate for printed circuit board having a superior heat resistance and humidity resistance and with a sufficient flame retarding property.

BACKGROUND OF THE INVENTION

In recent years, with the progress of miniaturization, thinner and lighter designs, and higher facilities, of electronic equipment, various electronic components to be used in these electronic equipment have also been miniaturized and made thinner, thus calling for an active technical development of printed circuit board, onto which these electronic components are to be mounted, to allow high-density mounting of electronic components.

Especially in these days, with the rapid progress of mounting technology, there is an increasingly strong demand for the supply of low-cost multilayer interconnection circuit board on which semiconductor chips such as LSI can be mounted with a high density. In such multilayer interconnection circuit board, it is important that the multilayer interconnection circuit boards be provided with a high reliability of electrical connection between wiring patterns formed with a fine pitch on plural layers respectively and with a superior high frequency characteristics.

With the conventional multilayer interconnection circuit boards in which electrical connection between layers of wiring is made by conventional through-hole structure fabricated by drilling and plating processes, it has become extremely difficult to satisfy requirements of such higher performance and higher facility electronic equipment, and hence circuit board having a new structure or a manufacturing method that allows high-density wiring are being developed to meet these requirements.

A typical example of such development can be found in the multilayer circuit board having all-layer inner via holes as disclosed in Japanese Laid-open Patent Hei 6-268345, wherein inner via holes are filled with a conductor for improved reliability of connection instead of plated copper conductors formed on the inner wall of through holes as has been commonly practiced in connecting wiring layers in the conventional multilayer printed circuit boards, and inner via holes (IVH) are formed immediately underneath component lands or between arbitrary wiring layers thereby realizing miniaturization of the circuit board and high-density mounting.

As a substrate for such a multilayer printed circuit board with an all-layer IVH structure, a substrate for printed circuit board fabricated by impregnating epoxy resin as an insulating material in a fibrous base material such as an aramid non-woven fabric is in general use. These circuit formation substrates have been employed in various electronic equipment that require small size and light weight because of their advantages of a low expansion coefficient, a low dielectric constant, and light weight.

However, as represented by the latest small portable telephones and digital video cameras which have been made remarkably smaller and lighter in weight for domestic use, the available functions have become extremely diversified; and in electronic equipment requiring microminiaturization, it has become necessary to mount a number of LSI chips on a small-area of printed circuit board with a high density. As a result, the chip-on-board technology with which LSI bare chips can be connected to bumps on a circuit board has become indispensable. In implementing this technology while maintaining a high level of reliability, there are extremely severe requirements on the substrate for printed circuit board such as mechanical characteristics including shock resistance and electrical characteristics such as dielectric constant and dielectric loss tangent in a high frequency band. The following problems which have been acceptable in domestic electronic equipment in general are drawing attention as serious problems.

1) Coming off of LSI bare chips due to poor reliability of connection between the LSI bare chips and the circuit board and to poor adhesion between the copper foil for wiring and the substrate, when subjected to a shock such as through dropping of an electronic equipment.

2) Decrease in dimensional stability due to heat experienced during die bonding of LSI bare chips.

3) Decline in dielectric and other characteristics due to humidity absorption of circuit board.

4) Substrate is flammable because of the core material used such as aramid fiber inside the circuit board; when one tries to provide flame retarding property, electrical characteristics and resistance against adverse environment will be lowered.

The above problems may be attributed to the combination of a number of conditions in configuring a substrate for printed circuit board, for example, composing a substrate with an insulating material comprising polymeric materials such as an epoxy resin main component of bisphenol group in combination with a curing agent based on an acid anhydride, or amine or phenol, or to the means of flame retardation based on conventional technology.

SUMMARY OF THE INVENTION

The present invention is based on a basic review of materials composing substrates for printed circuit board, especially insulating materials and curing reactions. It provides a substrate for printed circuit board that employs a thermosetting resin composition as the insulating material which can maintain with a high reliability heretofore conflicting requirements of flame retarding property and humidity resistance, heat resistance, and high frequency characteristics. In a substrate for printed circuit board that employs as the insulating material a thermosetting resin composition comprising an epoxy resin as main component and a curing agent, it uses as the main component an epoxy resin containing a brominated phenol novolac type epoxy resin having a biphenyl skeleton as shown in the following chemical formula.

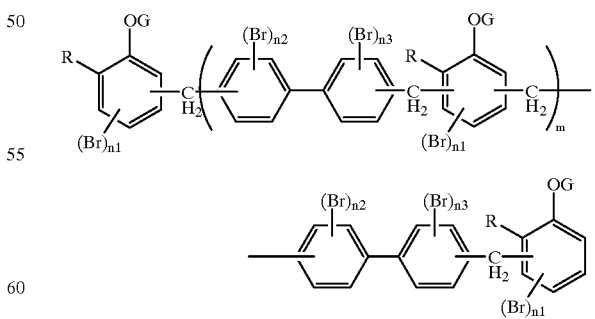

G: glycidyl radical
R: $CH_3$, H
m=0–4
n1=0–2 n2=0–2 n3=0–2 n1+n2+n3=2–6

It also uses a curing agent containing a brominated phenol novolac type curing resin having a biphenyl skeleton as shown in the following chemical formula.

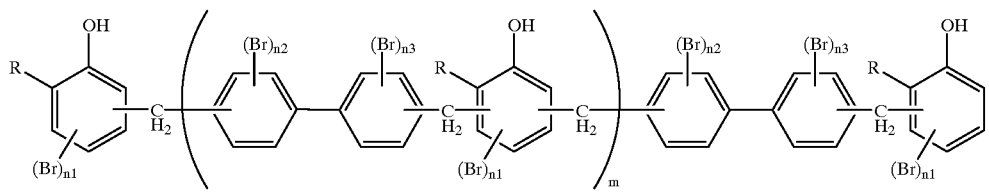

R: $CH_3$, H m=0–4 n1=0–2 n2=0–2 n3=0–2 n1+n2+n3=2–6

It further uses, as the epoxy resin main component, an epoxy resin including a brominated phenol novolac type epoxy resin having a biphenyl skeleton and, as the curing agent, a curing agent including a brominated phenol novolac type curing resin having a biphenyl skeleton. Consequently, the obtained thermosetting resin composition contains bromine by 10–40 wt % of the total weight, thus providing the substrate for printed circuit board employing the thermosetting resin composition as the insulating material an extremely high flame retarding property and a superior heat resistance and humidity resistance, as well as a high insulating reliability and superior high frequency characteristics.

DESCRIPTION OF EXEMPLARY EMBODIMENTS

A detailed description of exemplary embodiments of the present invention will be made in the following.

First Exemplary Embodiment

Main component: Bisphenol-A type epoxy resin+ brominated biphenyl phenol novolac type epoxy resin (epoxy equivalent: 380; bromine content: 30 wt %) 100 parts by weight Curing agent: Phenol novolac curing agent 43 parts by weight Curing accelerator: Imidazole 0.2 parts by weight The main component, curing agent, and curing accelerator were mixed in the above ratio and dissolved in methyl-ethyl ketone to obtain a resin solution of 60 wt %. The solution was then introduced into an aluminum vat, dried in vacuum at room temperature for 1 hour, and heated to 140° C. to make it into a B stage. Subsequently, the half-cured resin composition was pulverized and introduced into a mold, heated in vacuum under a pressure until completely cured, and a 100 μm thick, 100 mm×100 mm size specimen of a substrate for printed circuit board was obtained, the secondary curing condition being keeping at 200° C. for 1 hour.

Next, a specimen of a substrate for printed circuit board employing a reinforcing material was prepared by impregnating the above 60 wt % resin solution in an aramid non-woven fabric (Technora manufactured by Teijin Ltd.), drying at 140° C. to make a prepreg, heating in vacuum at 200° C. under a pressure of 55 kg/cm² for 1 hour for complete curing, and a 100 μm thick, 100 mm×100 mm size specimen of a substrate for printed circuit board was obtained. The resin content of the specimen was 50 wt % of the total weight of the prepreg.

Next, using this specimen, the change of rate of humidity absorption and of dielectric constant was measured before and after humidity resistance test at 60° C.: 95% RH for 300 hours.

A measurement of heat resistance was made by holding a specimen inside a drying oven, and heating at a temperature rise rate of 10° C./min. until a weight reduction of 1% has been reached, the temperature at that point being defined as the decomposition temperature.

Also a measurement of flammability was performed in accordance with the Underwriters Laboratories flammability testing conditions, and the evaluation criteria corresponding to the time to combustion were represented by V-2, V-1, and V-0. The bromine content of the thermosetting resin composition in this exemplary embodiment was 21 wt % of the total weight.

For the second and subsequent exemplary embodiments of the present invention, as the method of preparation, size, shape, and measuring conditions of each value to be measured of specimens are the same as in the first exemplary embodiment, only composition of the thermosetting resins and their compounding ratio will be described.

Second Exemplary Embodiment

Main component: Bisphenol-A type epoxy resin (epoxy equivalent: 270) 100 parts by weight Curing agent: Phenol novolac+brominated biphenyl phenol novolac curing agent (bromine content: 60 wt %) 73 parts by weight Curing accelerator: Imidazole 0.2 parts by weight In this exemplary embodiment, the bromine content of the thermosetting resin composition was 25 wt % of the total weight.

Third Exemplary Embodiment

Main component: Bisphenol-A type epoxy resin+ brominated biphenyl phenol novolac epoxy resin (epoxy equivalent: 330; bromine content 10 wt %) 100 parts by weight Curing agent: Phenol novolac+brominated phenol novolac (bromine content: 15 wt %) 45 parts by weight Curing accelerator: Dimethylimidazole 0.2 parts by weight In this exemplary embodiment, the bromine content of the thermosetting resin composition was 12 wt % of the total weight.

Fourth Exemplary Embodiment

Main component: Bisphenol-A type epoxy resin+ tetrabromo-bisphenol-A type epoxy resin (epoxy equivalent: 290; bromine content: 36 wt %) 100 parts by weight Curing agent: Brominated biphenyl phenol novolac (bromine content: 40 wt %) 100 parts by weight
Curing accelerator: Imidazole 0.2 parts by weight In this exemplary embodiment, the bromine content of the thermosetting resin composition was 38 wt % of the total weight.

Fifth Embodiment

Main component: Bisphenol-A type epoxy resin+brominated biphenyl phenol novolac type epoxy resin
   (epoxy equivalent: 350; bromine content: 20 wt %) 100 parts by weight
Curing agent: Phenol novolac+brominated biphenyl phenol novolac (bromine content: 50 wt %) 50 parts by weight
Curing accelerator: Imidazole 0.2 parts by weight In this exemplary embodiment, the bromine content of the thermosetting resin composition was 30 wt % of the total weight.

For each of the foregoing exemplary embodiments, flame retarding property, electrical characteristics and various mechanical characteristics have been described of the thermosetting resin composition composing respective substrate for printed circuit board. Next, an exemplary embodiment of a substrate for printed circuit board comprising a thermosetting resin composition characteristic of the present invention will be described in the following.

Sixth Exemplary Embodiment

After impregnating a resin solution obtained in the first exemplary embodiment in an aramid non-woven fabric (Technora manufactured by Teijin Ltd.), a prepreg with a thickness of 130 μm was prepared by drying at 140° C. After disposing a copper foil on both sides of the prepreg, the prepreg was heated in vacuum at 200° C. under a pressure of 55 kg/cm$^2$ for 1 hour to obtain a substrate for printed circuit board.

Seventh Exemplary Embodiment

After impregnating a resin solution obtained in the second exemplary embodiment in an aramid non-woven fabric (Technora manufactured by Teijin Ltd.), a prepreg with a thickness of 130 μm was prepared by drying at 140° C. PET films were laminated on both sides of the prepreg, and via holes with a diameter of 200 μm were bored by a CO$_2$ gas laser at predetermined locations of the prepreg. After filling a conductive paste in the via holes by printing, the PET films on both sides of the prepreg were removed. Subsequently, copper foils were laminated on both sides of the prepreg and then the prepreg was completely cured in vacuum by heating at 200° C. under a pressure of 55 kg/cm$^2$ for 1 hour to obtain a substrate for printed circuit board in which the copper foils on both sides are made electrically conductive.

A printed circuit board can be obtained by forming wiring patterns by etching the copper foils provided on the surfaces of the substrate for circuit formation as described in the above sixth and seventh exemplary embodiments.

Eighth Exemplary Embodiment

After coating the resin solution obtained in the third exemplary embodiment on top of a printed circuit board formed by using a substrate as obtained by the seventh exemplary embodiment, an insulation layer was formed by drying and heat curing the resin solution. Using this insulating layer as a substrate for printed circuit board, via holes were bored by a CO$_2$ gas laser as described in the seventh exemplary embodiment. Subsequently, by employing an additive method copper plating was made on the inside walls of the via holes and a wiring pattern was formed on top of the insulating layer with plated copper. A printed circuit board having a multilayer interconnection is produced by repeating this build-up process.

For the sake of comparison, compounding examples of a substrate for printed circuit board which is made flame retardant by the conventional method are shown below. Here, the specimens for measurement of various characteristics were prepared based on each respective exemplary embodiment of the present invention and measurements were made under the same conditions.

COMPARATIVE EXAMPLE 1

Main component: Bisphenol-A type epoxy resin
   (epoxy equivalent: 270) 100 parts by weight
Curing agent: Brominated phenol novolac 40 parts by weight
Curing accelerator: Imidazol 0.2 parts by weight In this comparative example, the bromine content of the thermosetting resin composition is 20 wt % of the total weight.

COMPARATIVE EXAMPLE 2

Main component: Tetrabromobisphenol-A type epoxy resin+bisphenol-A type epoxy resin
   (epoxy equivalent: 320) 100 parts by weight
Curing agent: Dicyanodiamide 4 parts by weight
Curing accelerator: Imidazol 0.2 parts by weight In this comparative example, the bromine content of the thermosetting resin composition is 20 wt % of the total weight.

Next, various characteristics were measured on specimens consisting only of the thermosetting resin compositions in accordance with each of the exemplary embodiments and comparative examples, the result of which being shown in Table 1. Various characteristics were also measured on specimens made from a prepreg prepared by impregnating the thermosetting resin compositions in an aramid non-woven fabric, the result of which being shown in Table 2.

TABLE 1

|  | Bromine Content (wt %) | Heat Resist. (Decomposition Temp., ° C.) | Humidity Resistance (ε change rate, %) | Moisture Absorption Rate (%) |
| --- | --- | --- | --- | --- |
| 1$^{st}$ Embod. | 21 | 340 | 3.2 | 0.9 |
| 2$^{nd}$ Embod. | 25 | 320 | 3.4 | 1.0 |
| 3$^{rd}$ Embod. | 12 | 350 | 2.9 | 0.8 |
| 4$^{th}$ Embod. | 38 | 310 | 3.9 | 1.1 |
| 5$^{th}$ Embod. | 30 | 320 | 2.7 | 0.5 |
| Compar. Ex. 1 | 20 | 330 | 5.8 | 1.4 |
| Compar. Ex. 2 | 20 | 330 | 5.9 | 1.5 |

Note: Specimens of the exemplary embodiments and the comparative examples all conformed to the UL 94 flammability standard V-0.

TABLE 2

|  | Bromine Content (wt %) | Heat Resist. (Decomposition Temp., ° C.) | Humidity Resistance (ε change rate, %) | Moisture Absorption Rate (%) |
| --- | --- | --- | --- | --- |
| 1st Embod. | 21 | 340 | 3.8 | 1.4 |
| 2nd Embod. | 25 | 320 | 4.0 | 1.5 |

TABLE 2-continued

|  | Bromine Content (wt %) | Heat Resist. (Decomposition Temp., °C.) | Humidity Resistance (ε change rate, %) | Moisture Absorption Rate (%) |
|---|---|---|---|---|
| 3rd Embod. | 12 | 350 | 3.5 | 1.3 |
| 4th Embod. | 38 | 310 | 4.5 | 1.6 |
| 5th Embod. | 30 | 320 | 3.2 | 1.0 |
| Compar. Ex. 1 | 20 | 330 | 6.4 | 1.9 |
| Compar. Ex. 2 | 20 | 330 | 6.5 | 2.0 |

Note: Specimens of the exemplary embodiments and the comparative examples all conformed to the UL flammability standard V-0.

As is obvious from Tables 1 and 2, although conventional flame retarding substrates for printed circuit board (comparative examples) satisfy the V-0 flame retarding property criterion, its humidity resistance remains to be as low as that of conventional epoxy resins as it has been difficult to simultaneously satisfy both requirements of flame retarding property by bromination and humidity resistance, thereby not yet satisfying the electrical characteristics required of a substrate for printed circuit board.

On the contrary, in each of the exemplary embodiments of the present invention, as a material containing at least either a brominated phenol novolac type epoxy resin having a biphenyl skeleton or a brominated phenol novolac type curing resin having a biphenyl skeleton is employed as a composing material of the thermosetting resin composition, it is possible to prevent deterioration of heat resistance which has been considered an inherent fault in making thermosetting resin compositions based on epoxy resins flame retardant, and to obtain a substrate for printed circuit board with a superior flame retarding property.

Incidentally, in the fifth exemplary embodiment of the present invention, basic components comprise a main component containing a phenyl novolac type epoxy resin having a biphenyl skeleton, and a curing agent containing a phenol novolac type curing resin also having a biphenyl skeleton but with its glycidyl ether radical substituted with a hydroxyl group with other chemical structure remaining the same. Consequently, the skeleton of the epoxy resin main component and that of the curing resin match each other, the epoxy radical and the hydroxyl group react efficiently leaving little residual nonreacted hydroxyl group, thereby exhibiting low humidity absorption and superior dielectric properties as can be seen in the tables.

Also, the phenol novolac type epoxy resin having a biphenyl skeleton and the phenol novolac type curing resin having a biphenyl skeleton employed in the present invention both show a large depression in the resin viscosity when heated, and provide their resin solutions a high wettability toward reinforcing materials such as glass fiber and aramid fiber, thus presenting a superior impregnating capability of resin solutions in a manufacturing process of substrates for printed circuit board, and greatly contributing to a superior humidity resistance of obtained substrates for printed circuit board.

Furthermore, in the present invention, the reason for making the bromine content in the thermosetting resin composition within a range 10 wt % to 40 wt % of the total weight is because, when the content is less than 10 wt %, the V-0 grade standard of the UL 94 flammability test can not be satisfied, whereas when the content is beyond 40 wt %, the heat resistance is seriously affected. The reason for making the bromine content in the epoxy resin main component within 10 wt % to 30 wt % and the bromine content in the curing agent within 20 wt % to 60 wt % is to make sure that the compounding ratio of the epoxy resin main component and the curing agent at which a substrate for printed circuit board of the present invention can be obtained in an optimum condition can be included in the above-mentioned predetermined range of bromine contents of the thermosetting resin composition.

As is obvious from the above described exemplary embodiments, it is possible with the present invention to secure flame retarding property by brominating epoxy resin having a biphenyl skeleton as well as to obtain a substrate for printed circuit board which comprises an insulating material having a superior heat resistance and humidity resistance as a composing material. Bromination will not harm good points of an epoxy resin having a biphenyl skeleton of being superior in heat resistance and in humidity resistance. As a result, substrates for printed circuit board and printed circuit board prepared by using this substrate related to the present invention will provide a superior high frequency characteristic such as dielectric constant and dielectric loss tangent, and stability against moisture without sacrificing its heat resistance.

We claim:

1. A substrate for printed circuit board including an insulating material said material comprising a thermosetting resin composition comprising an epoxy resin main component and a curing agent, said epoxy resin main component including a brominated phenol novolac epoxy resin having a biphenyl skeleton as given by the formula:

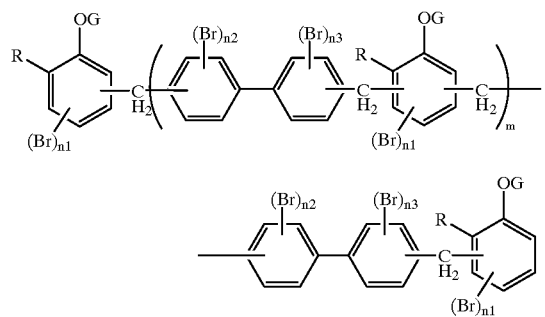

G: glycidyl radical
R: $CH_3$, H
m=0–4
n1=0–2
n2=0–2
n3=0–2
n1+n2+n3=2–6.

2. A substrate for printed circuit board according to claim 1, wherein the bromine content of the epoxy resin main component is in a range 10 wt % to 30 wt %.

3. A substrate for printed circuit board according to claim 1, wherein the thermosetting resin composition has a bromine content within a range of 10 wt % to 40 wt % of the total weight.

4. A substrate for printed circuit board according to claim 1, wherein the thermosetting resin composition is impregnated in a material selected from the group consisting of a glass woven fabric, a glass non-woven fabric, an aramid woven fabric or an aramid run-woven fabric, and provided with a metallic foil on at least one side of it.

5. A substrate for printed circuit board comprising as an insulating material a thermosetting resin composition comprising an epoxy resin main component and a curing agent, wherein said curing agent contains a brominated phenol novolac curing resin having a biphenyl skeleton as given by the formula:

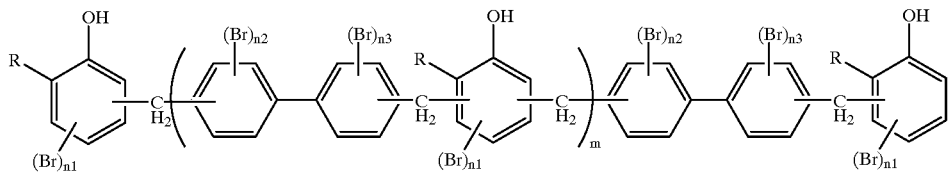

R: CH$_3$, H
m=0–4
n1=0–2
n2=0–2
n3=0–2
n1+n2+n3=2–6.

6. A substrate for printed circuit board according to claim 5, wherein the bromine content of the curing agent is in a range 20 wt % to 60 wt %.

7. A substrate for printed circuit board comprising as an insulating material a thermosetting resin composition comprising an epoxy resin main component and a curing agent, wherein said epoxy resin main component contains a brominated phenol novolac epoxy resin having a biphenyl skeleton and said curing agent contains bromine.

8. A substrate for printed circuit board comprising as an insulating material a thermosetting resin composition comprising an epoxy resin main component and a curing agent, wherein said epoxy resin main component contains an epoxy resin containing bromine, and said curing agent contains a brominated phenol novolac curing resin having a biphenyl skeleton.

9. A substrate for printed circuit board comprising as an insulating material a thermosetting resin composition comprising an epoxy resin main component and a curing agent, wherein said epoxy resin main component contains a brominated phenol novolac epoxy resin having a biphenyl skeleton, and said curing agent contains a brominated phenol novolac type curing resin having a biphenyl skeleton.

* * * * *